United States Patent
Oba (10) Patent No.: US 11,387,398 B2
(45) Date of Patent: Jul. 12, 2022

(54) THERMOELECTRIC POWER GENERATION MODULE

(71) Applicant: KELK Ltd., Kanagawa (JP)

(72) Inventor: Masakazu Oba, Kanagawa (JP)

(73) Assignee: KELK Ltd., Kanagawa (JP)

( * ) Notice: Subject to any disclaimer, the term of this patent is extended or adjusted under 35 U.S.C. 154(b) by 0 days.

(21) Appl. No.: 17/360,608

(22) Filed: Jun. 28, 2021

(65) Prior Publication Data

US 2022/0005996 A1   Jan. 6, 2022

(30) Foreign Application Priority Data

Jul. 3, 2020   (JP) .............................. JP2020-115892

(51) Int. Cl.
    *H01L 35/08*   (2006.01)

(52) U.S. Cl.
    CPC .................... *H01L 35/08* (2013.01)

(58) Field of Classification Search
    CPC .......... H01L 35/08; H01L 35/02; H01L 35/04
    See application file for complete search history.

(56) References Cited

U.S. PATENT DOCUMENTS

| | | | | |
|---|---|---|---|---|
| 2003/0019216 A1* | 1/2003 | Itakura | .................... | F25B 21/02 62/3.7 |
| 2005/0016183 A1* | 1/2005 | Tateyama | ............. | H05K 1/0204 136/204 |
| 2006/0118159 A1* | 6/2006 | Tsuneoka | ................ | H01L 35/32 136/211 |
| 2006/0180191 A1* | 8/2006 | Yasutake | .................. | H01L 35/08 136/211 |
| 2008/0135082 A1* | 6/2008 | Hirono | .................... | H01L 35/08 136/200 |
| 2008/0163916 A1* | 7/2008 | Tsuneoka | ................ | H01L 35/32 136/203 |
| 2017/0373238 A1* | 12/2017 | Makino | ................... | H01L 35/10 |

FOREIGN PATENT DOCUMENTS

JP          H02174143          7/1990

* cited by examiner

*Primary Examiner* — Golam Mowla
(74) *Attorney, Agent, or Firm* — Fish & Richardson P.C.

(57) ABSTRACT

A thermoelectric power generation module includes two substrates, a thermoelectric conversion element, a sealing portion sealing peripheral edges of upper and lower surfaces, a first solder between the upper surface and the sealing portion, and a second solder between the lower surface and the sealing portion. At least one of outer and inner edges of the first solder or the sealing portion is deviated from the first solder or the sealing portion. At least one of outer and inner edges of the second solder or the sealing portion is deviated from the second solder or the sealing portion. At least one of the outer and inner edges of the first solder has a fillet shape between the upper surface and the sealing portion. At least one of the outer and inner edges of the second solder has a fillet shape between the lower surface and the sealing portion.

16 Claims, 7 Drawing Sheets

THERMOELECTRIC POWER GENERATION MODULE

CROSS-REFERENCE TO RELATED APPLICATION(S)

The present application claims priority to and incorporates by reference the entire contents of Japanese Patent Application No. 2020-115892 filed in Japan on Jul. 3, 2020.

BACKGROUND OF THE INVENTION

1. Field of the Invention

The present disclosure relates to a thermoelectric power generation module.

2. Description of the Related Art

In a semiconductor device, a solder sealing structure is known in which a substrate in which a semiconductor element is mounted on a first main surface and a box-shaped cap that covers the semiconductor element are sealed by soldering (for example, JP H02-174143 A). In the technique disclosed in JP H02-174143 A, the solder is held in a solder wet area while maintaining a fillet shape.

A thermoelectric power generation module using a thermoelectric conversion element is known. In the thermoelectric power generation module, the thermoelectric conversion element is disposed between a pair of substrates. By giving a temperature difference between the pair of substrates, the thermoelectric power generation module generates power by a seebeck effect. Since there is a temperature difference between the pair of substrates, it is necessary to seal a peripheral edge portion of the pair of substrates in order to prevent water generated on a surface of the thermoelectric power generation module by dew condensation from entering the thermoelectric power generation module. However, when a flux-containing solder is used, a cavity may be formed in the solder due to the flux coming out, and a sealing property may deteriorate.

SUMMARY OF THE INVENTION

It is an object of the present invention to at least partially solve the problems in the conventional technology.

According to an embodiment of the present invention, a thermoelectric power generation module comprises: a first substrate that includes a first surface; a second substrate that includes a second surface facing the first surface; a thermoelectric conversion element that is disposed between the first surface and the second surface; a sealing portion that is disposed between the first surface and the second surface, and seals a peripheral edge portion of the first surface and a peripheral edge portion of the second surface; a first solder that is disposed between the first surface and the sealing portion; and a second solder that is disposed between the second surface and the sealing portion, wherein the first solder and the sealing portion are disposed so that at least one of an outer edge portion and an inner edge portion of the first solder or the sealing portion is deviated from the first solder or the sealing portion when viewed in a thickness direction, the second solder and the sealing portion are disposed so that at least one of an outer edge portion and an inner edge portion of the second solder or the sealing portion is deviated from the second solder or the sealing portion when viewed in a thickness direction, at least one of the outer edge portion and the inner edge portion of the first solder has a fillet shape between the first surface and the sealing portion, and at least one of the outer edge portion and the inner edge portion of the second solder has a fillet shape between the second surface and the sealing portion.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, embodiments according to the present disclosure will be described with reference to the drawings, but the present disclosure is not limited to the embodiments. Components of a plurality of embodiments, which will be described below, can be combined appropriately. Some components may not be used.

In the embodiment, the positional relationship of each part will be described using the terms "left", "right", "front", "rear", "up", and "down". These terms indicate a relative position or a direction with respect to a center of a thermoelectric power generation module 1. A right and left direction, a front and rear direction, and an up and down direction are orthogonal to each other.

Figure 1:
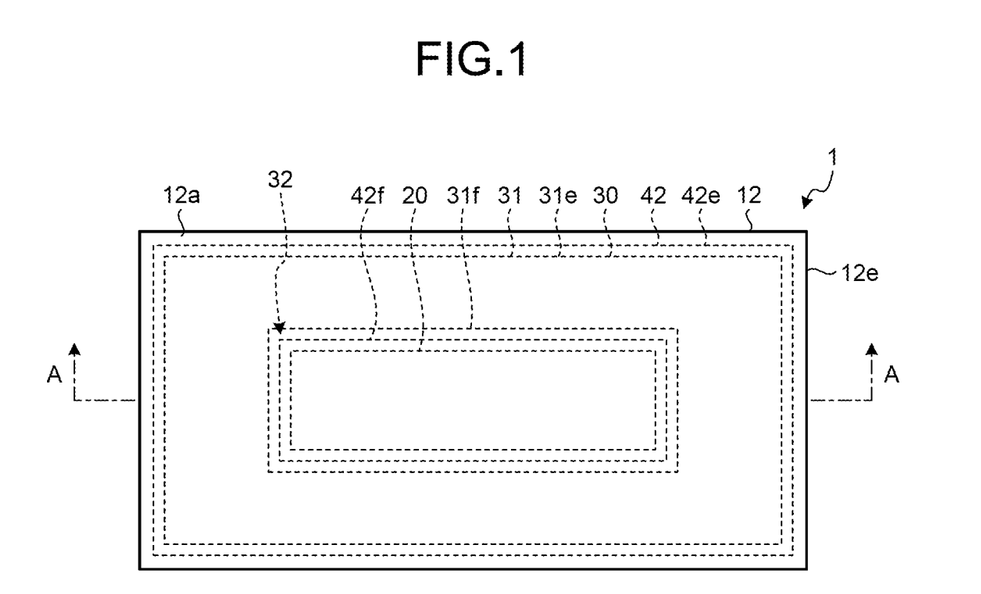
FIG. 1 is a plan view illustrating a thermoelectric power generation module according to an embodiment.
Figure 2:
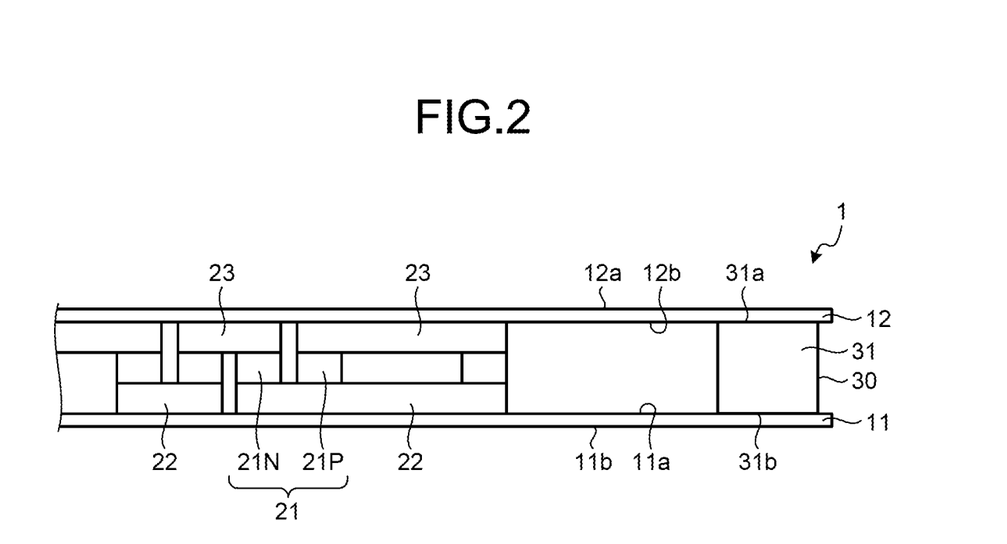
FIG. 2 is a cross-sectional view illustrating a thermoelectric power generation module according to an embodiment, and is a cross-sectional view taken along line A-A of FIG. 1.
Figure 3:
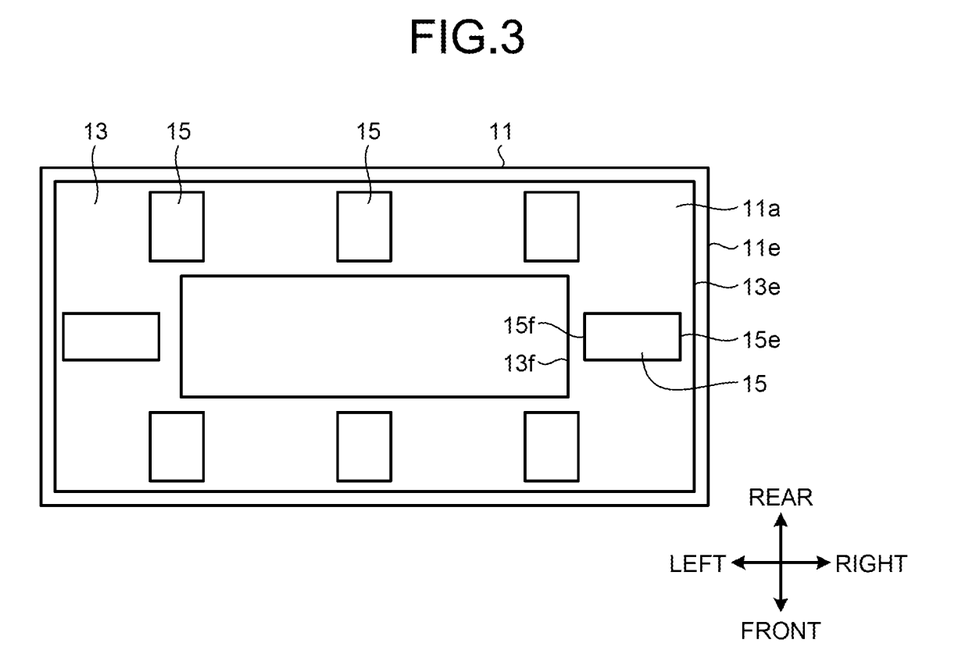
FIG. 3 is a plan view illustrating a first surface of a first substrate of a thermoelectric power generation module according to an embodiment.

Thermoelectric Power Generation Module FIG. 1 is a plan view illustrating the thermoelectric power generation module according to an embodiment. FIG. 2 is a cross-sectional view illustrating the thermoelectric power generation module according to an embodiment, and is a cross-sectional view taken along line A-A of FIG. 1. FIG. 3 is a plan view illustrating a first surface of a first substrate of the thermoelectric power generation module according to an embodiment. As illustrated in FIGS. 1 and 2, the thermoelectric power generation module 1 includes a first substrate 11, a second substrate 12, a thermoelectric conversion element 21 disposed between the first substrate 11 and the second substrate 12, and a sealing portion 30.

Each of the first substrate 11 and the second substrate 12 is formed of an electrical insulation material. In the embodiment, each of the first substrate 11 and the second substrate 12 is a polyimide substrate. As illustrated in FIG. 3, in the embodiment, the first substrate 11 and the second substrate 12 are formed in a rectangular shape. In the embodiment, a thickness of the first substrate 11 and the second substrate 12 is 25 μm.

The first substrate 11 and the second substrate 12 face each other via a gap. In the embodiment, the second substrate 12 is disposed above the first substrate 11. The first substrate 11 includes an upper surface 11a (first surface) and a lower surface 11b. The second substrate 12 includes a lower surface 12b (second surface) facing the upper surface 11a of the first substrate 11, and an upper surface 12a.

One or more thermoelectric conversion elements 21 are disposed between the upper surface 11a of the first substrate 11 and the lower surface 12b of the second substrate 12. A plurality of thermoelectric conversion elements 21 are connected by a first electrode 22 and a second electrode 23.

The thermoelectric conversion element 21 is formed of a thermoelectric material. Examples of the thermoelectric material forming the thermoelectric conversion element 21 include a manganese silicide compound (Mn—Si), a magnesium silicide compound (Mg—Si—Sn), a skutterudite compound (Co—Sb), a half-Heusler compound (Zr—Ni—Sn), and a bismuth tellurium compound (Bi—Te). The thermoelectric conversion element 21 may be formed of one compound selected from the manganese silicide compound, the magnesium silicide compound, the skutterudite compound, the half-Heusler compound, or the bismuth tellurium compound, and may be formed of a combination of at least two compounds.

The thermoelectric conversion element 21 includes a p-type element 21P and an n-type element 21N. Each of the p-type element 21P and the n-type element 21N is disposed in a predetermined plane. In a front and rear direction, the p-type element 21P and the n-type element 21N are disposed alternately. In a right and left direction, the p-type element 21P and the n-type element 21N are disposed alternately.

The first electrode 22 and the second electrode 23 are formed of metal. Examples of the metal forming the first electrode 22 and the second electrode 23 include copper (Cu), an alloy containing copper, nickel (Ni), an alloy containing nickel, aluminum (Al), and an alloy containing aluminum. A structure of the first electrode 22 and the second electrode 23 may be a two-layer or three-layer structure in which two or three of Cu, Al, and Ni are combined. The surfaces of the first electrode 22 and the second electrode 23 may be coated with a nickel film.

The first electrode 22 is provided on the upper surface 11a of the first substrate 11. A plurality of the first electrodes 22 are provided in a predetermined plane parallel to the upper surface 11a of the first substrate 11. The second electrode 23 is provided on the lower surface 12b of the second substrate 12. A plurality of the second electrodes 23 are provided in a predetermined plane parallel to the lower surface 12b of the second substrate 12. The first electrode 22 and the second electrode 23 are connected to p-type element 21P and n-type element 21N, which are adjacent to each other, respectively.

The first electrode 22 and the second electrode 23 connect a plurality of the thermoelectric conversion elements 21 in series. A series circuit is formed in which a plurality of the thermoelectric conversion elements 21 are connected in series by the first electrode 22 and the second electrode 23.

A pn element pair is formed by electrically connecting the p-type element 21P and the n-type element 21N via the first electrode 22 and the second electrode 23. A plurality of the pn element pairs are connected in series by the first electrode 22 and the second electrode 23 so that the series circuit including a plurality of the thermoelectric conversion elements 21 is formed.

When a current is supplied to the thermoelectric conversion element 21, the thermoelectric power generation module 1 absorbs or generates heat due to a Peltier effect. By giving a temperature difference between the first substrate 11 and the second substrate 12, the thermoelectric power generation module 1 generates power by the seebeck effect.

The lower surface of the first electrode 22 disposed on the first substrate 11 is a cooling surface of the thermoelectric power generation module 1. The upper surface of the second electrode 23 disposed on the second substrate 12 is a heating surface of the thermoelectric power generation module 1.

Figure 4:
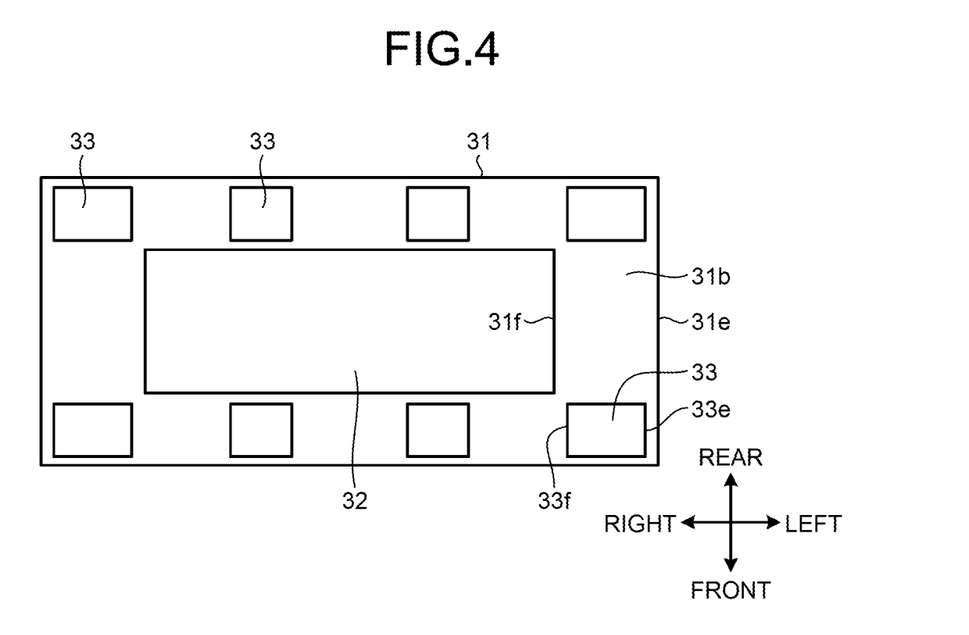
FIG. 4 is a plan view illustrating a sealing portion of a thermoelectric power generation module according to an embodiment.

FIG. 4 is a plan view illustrating a sealing portion of the thermoelectric power generation module according to the embodiment. The sealing portion 30 is formed in a frame shape. The sealing portion 30 is disposed so as to surround a periphery of the plurality of pn element pairs arranged in a plane direction when viewed in the up and down direction. The sealing portion 30 is disposed between the upper surface 11a of the first substrate 11 and the lower surface 12b of the second substrate 12, and seals a peripheral edge portion of the upper surface 11a of the first substrate 11 and a peripheral edge portion of the lower surface 12b of the second substrate 12. The sealing portion 30 is fixed to the upper surface 11a of the first substrate 11 and the lower surface 12b of the second substrate 12 by soldering. The sealing portion 30 is disposed so that at least any of an outer edge portion and an inner edge portion of the sealing portion 30 is deviated from the first substrate 11 and the second substrate 12 when viewed in the up and down direction (thickness direction). In the embodiment, the sealing portion 30 is disposed so that the outer edge portion and the inner edge portion of the sealing portion 30 are deviated from the first substrate 11 and the second substrate 12 when viewed in the up and down direction.

The sealing portion 30 includes a frame portion 31 and an opening portion 32 formed in a central portion of the frame portion 31.

The frame portion 31 is formed in a frame shape having a rectangular outer shape. The frame portion 31 is disposed so that at least any of the outer edge portion and the inner edge portion of the frame portion 31 is deviated from the first substrate 11 and the second substrate 12 when viewed in the up and down direction. In the embodiment, an outer edge portion 31e of the frame portion 31 is disposed so as to be deviated from an outer edge portion 11e of the first substrate 11 and an outer edge portion 12e of the second substrate 12 when viewed in the up and down direction. The frame portion 31 has a larger outer shape or a smaller outer shape compared with the first substrate 11 and the second substrate 12. In the embodiment, the frame portion 31 has a smaller outer shape compared with the first substrate 11 and the second substrate 12. In other words, in the embodiment, the outer edge portion 31e of the frame portion 31 is disposed so as to be deviated inward from the outer edge portion 11e of the first substrate 11 and the outer edge portion 12e of the second substrate 12 when viewed in the up and down direction. Accordingly, the frame portion 31 has a step portion between the first substrate 11 and the second substrate 12 in a side view seen in a direction orthogonal to the up and down direction. In the embodiment, the outer edge portion 31e of the frame portion 31 has a step portion recessed inward from the outer edge portion 11e of the first substrate 11 and the outer edge portion 12e of the second substrate 12 in the side view.

In the embodiment, a length of a step portion L1 is 3.0 mm. The length of the step portion L1 may be about 60% or more of a width of a first metal layer 13 and a second metal layer 14.

The frame portion 31 includes an upper surface 31a and a lower surface 31b. The upper surface 31a of the frame portion 31 faces the lower surface 12b of the second substrate 12. The lower surface 31b of the frame portion 31 faces the upper surface 11a of the first substrate 11.

The frame portion 31 is formed of, for example, a material having a property of getting wet with solder such as copper. The entire surfaces of the upper surface 31a and the lower surface 31b are areas wet with the solder.

In the embodiment, a thickness of the frame portion 31 is 1.2 mm.

The opening portion 32 is an opening formed in a rectangular shape in the central portion of the frame portion 31. A thermoelectric conversion element 20 is disposed in the opening portion 32.

Solder Pattern of Sealing Portion

A first solder pattern 33 is formed on the lower surface 31b of the frame portion 31. A second solder pattern 34 is formed on the upper surface 31a of the frame portion 31.

As illustrated in FIG. 4, the first solder pattern 33 is formed by dot-shaped solders arranged on the lower surface 31b of the frame portion 31 at intervals in a peripheral direction. The first solder pattern 33 is arranged so as to be alternately positioned with a first solder pattern 15 formed on the first substrate 11 in the peripheral direction in a state in which the first substrate 11 and the frame portion 31 are overlapped with each other. More specifically, the dot-shaped solders of the first solder pattern 33 of the frame portion 31 are positioned between the adjacent dot-shaped solders of the first solder pattern 15. An amount, an arrangement, a baking condition, and the like of the first solder pattern 15 and the first solder pattern 33 are set so as to wettably spread on the first metal layer 13 of the first substrate 11 and the lower surface 31b of the frame portion 31. A width L3 of the first solder pattern 33 is about 80% of a width L2 of the frame portion 31.

The second solder pattern 34 is formed in the same manner as the first solder pattern 33. The first solder pattern 33 is formed by dot-shaped solders arranged on the upper surface 31a of the frame portion 31 at intervals in a peripheral direction. The second solder pattern 34 is arranged so as to be alternately positioned with a second solder pattern 16 formed on the second substrate 12 in the peripheral direction in a state in which the first substrate 11 and the frame portion 31 are overlapped with each other. More specifically, the dot-shaped solders of the second solder pattern 34 of the frame portion 31 are positioned between the adjacent dot-shaped solders of the second solder pattern 16. An amount, an arrangement, a baking condition, and the like of the second solder pattern 16 and the second solder pattern 34 are set so as to wettably spread on the second metal layer 14 of the second substrate 12 and the upper surface 31a of the frame portion 31. A width of the second solder pattern 34 is about 80% of the width L2 of the frame portion 31.

Solder Pattern of First Substrate and Second Substrate

Figure 5:
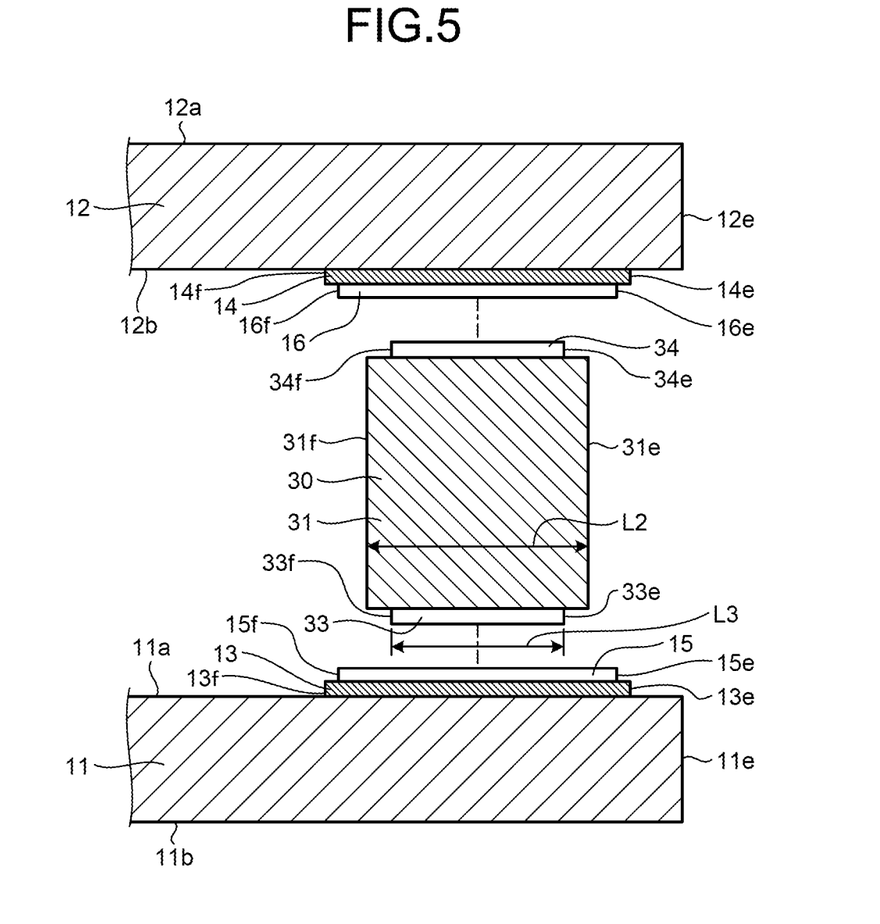
FIG. 5 is a cross-sectional view illustrating a first solder pattern, a second solder pattern, and a sealing portion.
Figure 6:
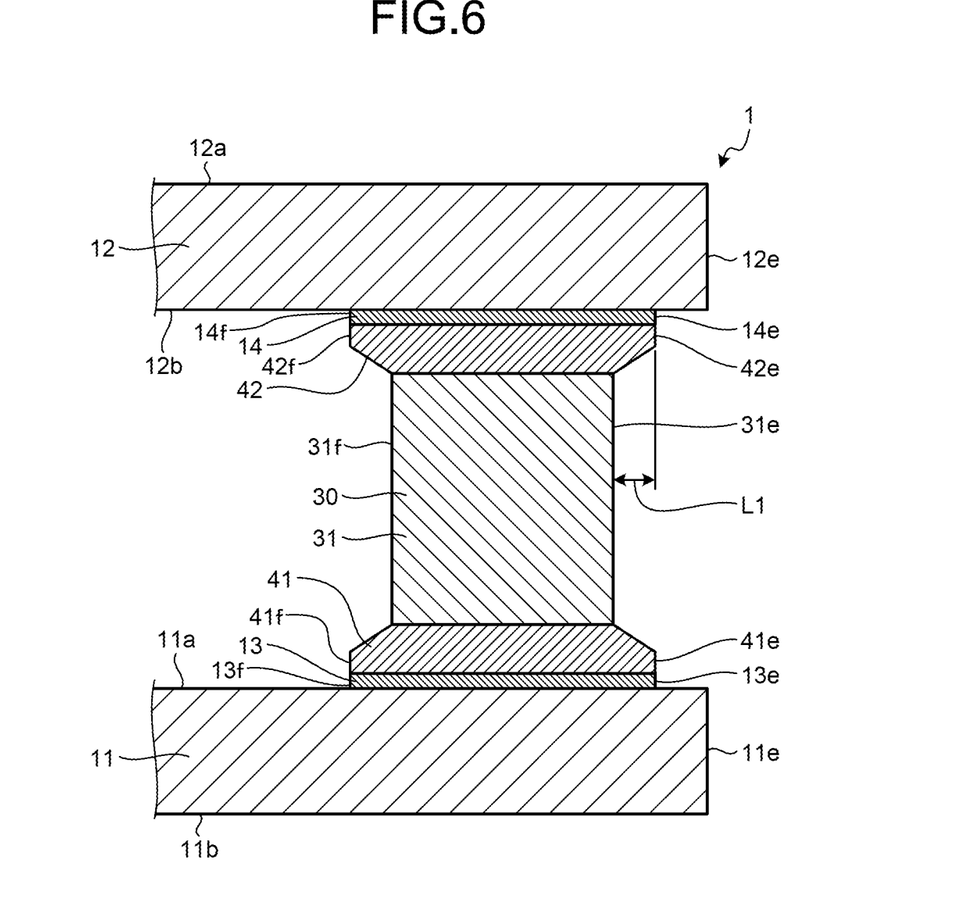
FIG. 6 is a cross-sectional view illustrating a thermoelectric power generation module according to an embodiment, and is a partial enlarged view of FIG. 2.

FIG. 5 is a cross-sectional view illustrating the first solder pattern, the second solder pattern, and the sealing portion. FIG. 6 is a cross-sectional view illustrating the thermoelectric power generation module according to the embodiment, and is a partial enlarged view of FIG. 2. The first metal layer 13 is formed on the upper surface 11a of the first substrate 11. The first metal layer 13 is formed in a rectangular frame shape disposed so as to surround the peripheral edge portion of the upper surface 11a. The first metal layer 13 is an area wet with the first solder. The first metal layer 13 is, for example, a metal material having a property of getting wet with solder such as copper.

The first metal layer 13 is disposed so that at least any of the outer edge portion and the inner edge portion of the first metal layer 13 is deviated from the frame portion 31 when viewed in the up and down direction. In the embodiment, the first metal layer 13 is disposed so that the outer edge portion and the inner edge portion of the first metal layer 13 are deviated from the frame portion 31 when viewed in the up and down direction. The first metal layer 13 has a larger outer shape or a smaller outer shape compared with the frame portion 31. In the embodiment, the first metal layer 13 has a larger outer shape compared with the frame portion 31. In the embodiment, an outer edge portion 13e of the first metal layer 13 is disposed so as to be deviated outward from the outer edge portion 31e of the frame portion 31 when viewed in the up and down direction. In the embodiment, an inner edge portion 13f of the first metal layer 13 is disposed so as to be deviated inward from an inner edge portion 31f of the frame portion 31 when viewed in the up and down direction.

The second metal layer 14 is formed on the lower surface 12b of the second substrate 12. The second metal layer 14 is formed in a rectangular frame shape disposed so as to surround the peripheral edge portion of the lower surface 12b. The second metal layer 14 is an area wet with the second solder. The second metal layer 14 is, for example, a metal material having a property of getting wet with solder such as copper.

The second metal layer 14 is disposed so that at least any of the outer edge portion and the inner edge portion of the second metal layer 14 is deviated from the frame portion 31 when viewed in the up and down direction. In the embodiment, the second metal layer 14 is disposed so that the outer edge portion and the inner edge portion of the second metal layer 14 are deviated from the frame portion 31 when viewed in the up and down direction. The second metal layer 14 has a larger outer shape or a smaller outer shape compared with the frame portion 31. In the embodiment, the second metal layer 14 has a larger outer shape compared with the frame portion 31. In the embodiment, an outer edge portion 14e of the second metal layer 14 is disposed so as to be deviated outward from the outer edge portion 31e of the frame portion 31 when viewed in the up and down direction. In the embodiment, an inner edge portion 14f of the second metal layer 14 is disposed so as to be deviated inward from the inner edge portion 31f of the frame portion 31 when viewed in the up and down direction.

In the embodiment, a thickness of the first metal layer 13 and the second metal layer 14 is 300 μm.

The first solder pattern 15 is formed on the first metal layer 13. The second solder pattern 16 is formed on the second metal layer 14.

As illustrated in FIG. 3, the first solder pattern 15 is formed by dot-shaped solders arranged on the upper surface 11a of the first substrate 11 at intervals in the peripheral direction. The first solder pattern 15 is arranged so as to be alternately positioned with the first solder pattern 33 formed on the frame portion 31 in the peripheral direction in a state in which the first substrate 11 and the frame portion 31 are overlapped with each other. More specifically, the dot-shaped solders of the first solder pattern 33 of the frame portion 31 are positioned between the adjacent dot-shaped solders of the first solder pattern 15.

The second solder pattern 16 is formed in the same manner as the first solder pattern 15. The second solder pattern 16 is formed by dot-shaped solders arranged on the lower surface 12b of the second substrate 12 at intervals in the peripheral direction. The second solder pattern 16 is arranged so as to be alternately positioned with the second solder pattern 34 formed on the frame portion 31 in the peripheral direction in a state in which the second substrate 12 and the frame portion 31 are overlapped with each other. More specifically, the dot-shaped solders of the second solder pattern 34 of the frame portion 31 are positioned between the adjacent dot-shaped solders of the second solder pattern 16.

As illustrated in FIG. 5, the first solder pattern 15 and the sealing portion 30 are disposed so that at least any of the outer edge portion and the inner edge portion of the first solder pattern 15 or the sealing portion 30 is deviated from the first solder pattern 15 or the sealing portion 30 when viewed in the up and down direction. A first solder 41 (refer to FIG. 6) and the sealing portion 30 are disposed so that at least any of the outer edge portion and the inner edge portion of the first solder 41 or the sealing portion 30 is deviated from the first solder 41 or the sealing portion 30 when viewed in the up and down direction. In other words, a wet area of the first solder 41 on the upper surface 11a of the first substrate 11 and a wet area of the first solder 41 on the sealing portion 30 are disposed so that at least any of the outer edge portion and the inner edge portion of the wet area on the upper surface 11a or the wet area on the sealing portion 30 is deviated from the wet area on the upper surface 11a or the wet area on the sealing portion 30 when viewed in the up and down direction. The second solder pattern 16 and the sealing portion 30 are disposed so that at least any of the outer edge portion and the inner edge portion of the second solder pattern 16 or the sealing portion 30 is deviated from the second solder pattern 16 or the sealing portion 30 when viewed in the up and down direction. A second solder 42 (refer to FIG. 6) and the sealing portion 30 are disposed so that at least any of the outer edge portion and the inner edge portion of the second solder 42 or the sealing portion 30 is deviated from the second solder 42 or the sealing portion 30 when viewed in the up and down direction. In other words, a wet area of the second solder 42 on the lower surface 12b of the second substrate 12 and a wet area of the second solder 42 on the sealing portion 30 are disposed so that at least any of the outer edge portion and the inner edge portion of the wet area on the lower surface 12b or the wet area on the sealing portion 30 is deviated from the wet area on the lower surface 12b or the wet area on the sealing portion 30 when viewed in the up and down direction.

At least any of an outer edge portion 15e of the first solder pattern 15 and an outer edge portion 16e of the second solder pattern 16 may be disposed so as to be deviated outward from the outer edge portion 31e of the frame portion 31 when viewed in the up and down direction. In the embodiment, the outer edge portion 15e of the first solder pattern 15 and the outer edge portion 16e of the second solder pattern 16 are disposed so as to be deviated outward from the outer edge portion 31e of the frame portion 31 when viewed in the up and down direction.

At least any of an inner edge portion 15f of the first solder pattern 15 and an inner edge portion 16f of the second solder pattern 16 may be disposed so as to be deviated inward from the inner edge portion 31f of the frame portion 31 when viewed in the up and down direction. In the embodiment, the inner edge portion 15f of the first solder pattern 15 and the inner edge portion 16f of the second solder pattern 16 are disposed so as to be deviated inward from the inner edge portion 31f of the frame portion 31 when viewed in the up and down direction.

Sealing Method with Solder and Action

As illustrated in FIG. 5, a baking treatment is performed in a state in which the first substrate 11, the frame portion 31, and the second substrate 12 are overlapped with each other in order from a lower side in the up and down direction so that the first substrate 11 is bonded with the frame portion 31 by soldering, and the frame portion 31 is bonded with the second substrate 12 by soldering.

In the state in which the first substrate 11, the frame portion 31, and the second substrate 12 are overlapped with each other, the first solder pattern 33 of the frame portion 31 is positioned to face the first solder pattern 15 of the first substrate 11. By being baked in the state, the first substrate 11 and the frame portion 31 are bonded by the first solder 41 obtained by melting and integrating the first solder pattern 15 of the first substrate 11 and the first solder pattern 33 of the frame portion 31. In this way, the upper surface 11a of the first substrate 11 and the sealing portion 30 are fixed by the first solder 41 obtained by baking the first solder pattern 15 of the first substrate 11 and the first solder pattern 33 of the frame portion 31. In other words, the first solder 41 is disposed between the upper surface 11a of the first substrate 11 and the sealing portion 30.

More specifically, the first solder 41 wettably spreads on the first metal layer 13 of the first substrate 11 and the lower surface 31b of the frame portion 31. When viewed in the up and down direction, the outer edge portion 13e of the first metal layer 13 on the first substrate 11 is positioned so as to be deviated outward from the outer edge portion 31e of the frame portion 31. When viewed in the up and down direction, the inner edge portion 13f of the first metal layer 13 on the first substrate 11 is positioned so as to be deviated inward from the inner edge portion 31f of the frame portion 31. Accordingly, the first solder 41 fixes the upper surface 11a of the first substrate 11 and the sealing portion 30 via the first metal layer 13. At least any of the outer edge portion and the inner edge portion of the first solder 41 has a fillet shape between the upper surface 11a of the first substrate 11 and the lower surface 31b of the frame portion 31. In the embodiment, the outer edge portion and the inner edge portion of the first solder 41 have a fillet shape between the upper surface 11a of the first substrate 11 and the lower surface 31b of the frame portion 31. More specifically, the first solder 41 has the fillet shape that expands from the lower surface 31b of the frame portion 31 toward the upper surface 11a of the first substrate 11. By forming the fillet shape, a bonding film for bonding the upper surface 11a of the first substrate 11 and the lower surface 31b of the frame portion 31 is uniformly formed. The bonding film between the upper surface 11a of the first substrate 11 and the lower surface 31b of the frame portion 31 prevents a cavity that communicates between an outer side and an inner side from being generated.

In the state in which the first substrate 11, the frame portion 31, and the second substrate 12 are overlapped with each other, the second solder pattern 34 of the frame portion 31 is positioned to face the second solder pattern 16 of the second substrate 12. By being baked in the state, the second substrate 12 and the frame portion 31 are bonded by the second solder 42 obtained by melting and integrating the second solder pattern 16 of the second substrate 12 and the second solder pattern 34 of the frame portion 31. In this way, the lower surface 12b of the second substrate 12 and the sealing portion 30 are fixed by the second solder 42 obtained by baking the second solder pattern 16 of the second substrate 12 and the second solder pattern 34 of the frame portion 31. In other words, the second solder 42 is disposed between the lower surface 12b of the second substrate 12 and the sealing portion 30.

More specifically, the second solder 42 wettably spreads on the second metal layer 14 of the second substrate 12 and the upper surface 31a of the frame portion 31. When viewed in the up and down direction, the outer edge portion 14e of the second metal layer 14 on the second substrate 12 is positioned so as to be deviated outward from the outer edge portion 31e of the frame portion 31. When viewed in the up and down direction, the inner edge portion 14f of the second metal layer 14 on the second substrate 12 is positioned so as to be deviated inward from the inner edge portion 31f of the frame portion 31. Accordingly, the second solder 42 fixes the lower surface 12b of the second substrate 12 and the sealing portion 30 via the second metal layer 14. At least any of the outer edge portion and the inner edge portion of the second solder 42 has a fillet shape between the lower surface 12b of the second substrate 12 and the upper surface 31a of the frame portion 31. In the embodiment, the outer edge portion and the inner edge portion of the second solder 42 have the fillet shape between the lower surface 12b of the second substrate 12 and the upper surface 31a of the frame portion 31. More specifically, the second solder 42 has the fillet shape that expands from the upper surface 31a of the frame portion 31 toward the lower surface 12b of the second substrate 12. By forming the fillet shape, a bonding film for bonding the lower surface 12b of the second substrate 12 and the upper surface 31a of the frame portion 31 is uniformly formed. The bonding film between the lower surface 12b of the second substrate 12 and the upper surface 31a of the frame portion 31 prevents a cavity that communicates between an outer side and an inner side from being generated.

In the embodiment, a thickness of the first solder 41 and the second solder 42 is 150 μm.

Effect

As described above, in the embodiment, the first solder 41 and the sealing portion 30 are disposed so that at least any of the outer edge portion and the inner edge portion of the first solder 41 or the sealing portion 30 is deviated from the first solder 41 or the sealing portion 30 when viewed in the up and down direction. Accordingly, at least any of the outer edge portion and the inner edge portion of the first solder 41 has a fillet shape between the upper surface 11a of the first substrate 11 and the lower surface 31b of the sealing portion 30. In the embodiment, the second solder 42 and the sealing portion 30 are disposed so that at least any of the outer edge portion and the inner edge portion of the second solder 42 or the sealing portion 30 is deviated from the second solder 42 or the sealing portion 30 when viewed in the up and down direction. Accordingly, at least any of the outer edge portion and the inner edge portion of the second solder 42 has a fillet shape between the lower surface 12b of the second substrate 12 and the upper surface 31a of the sealing portion 30. In the embodiment, a bonding film for bonding the lower surface 12b of the second substrate 12 and the upper surface 31a of the frame portion 31 can be formed uniformly. In the embodiment, the bonding film between the lower surface 12b of the second substrate 12 and the upper surface 31a of the frame portion 31 can prevent a cavity that communicates between an outer side and an inner side from being generated. According to the present disclosure, the sealing property can be improved.

In the embodiment, the first solder 41 fixes the upper surface 11a of the first substrate 11 and the sealing portion 30 via the first metal layer 13. In the embodiment, the second solder 42 fixes the lower surface 12b of the second substrate 12 and the sealing portion 30 via the second metal layer 14. In the embodiment, the first solder 41 and the second solder 42 can be formed in the fillet shape by the first metal layer 13 and the second metal layer 14.

In the embodiment, at least any of an outer edge portion 41e of the first solder 41 and an outer edge portion 42e of the second solder 42 is disposed so as to be deviated outward from the outer edge portion 31e of the frame portion 31 when viewed in the up and down direction. In the embodiment, at least any of an inner edge portion 41f of the first solder 41 and an inner edge portion 42f of the second solder pattern 42 is disposed so as to be deviated inward from the inner edge portion 31f of the frame portion 31 when viewed in the up and down direction. In the embodiment, the first solder 41 can be formed in the fillet shape that expands from the lower surface 31b of the frame portion 31 toward the upper surface 11a of the first substrate 11. In the embodiment, the second solder 42 can be formed in the fillet shape that expands from the upper surface 31a of the frame portion 31 toward the lower surface 12b of the second substrate 12.

Figure 8:
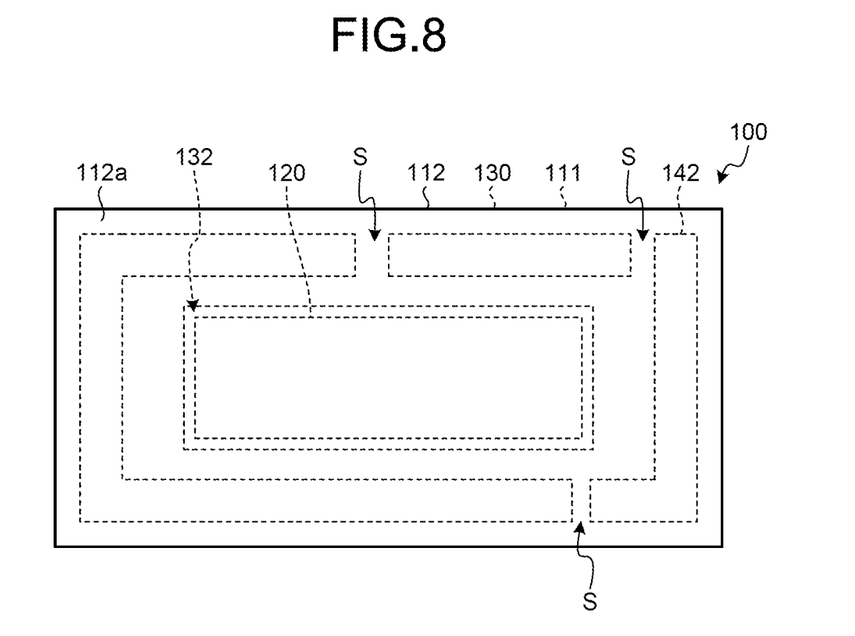
FIG. 8 is a plan view illustrating a thermoelectric power generation module in the related art.
Figure 9:
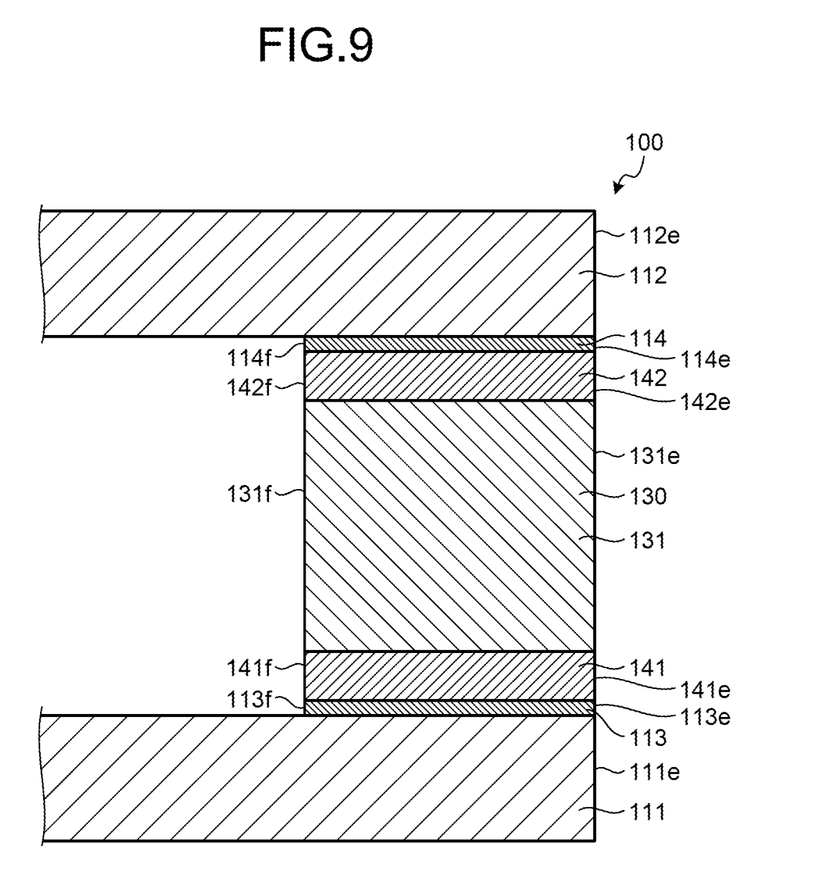
FIG. 9 is a cross-sectional view illustrating a thermoelectric power generation module in the related art.

On the other hand, a thermoelectric power generation module 100 in the related art will be described with reference to FIGS. 8 and 9. FIG. 8 is a plan view illustrating the thermoelectric power generation module in the related art. FIG. 9 is a cross-sectional view illustrating the thermoelectric power generation module in the related art. The thermoelectric power generation module 100 in the related art includes a first substrate 111, a second substrate 112, a thermoelectric conversion element 120 disposed between the first substrate 111 and the second substrate 112, and a sealing portion 130. A frame portion 131 has the same outer shape as the first substrate 111 and the second substrate 112. The frame portion 131 does not have a step portion between the first substrate 111 and the second substrate 112 in a side view. A first metal layer 113 and a second metal layer 114 have the same outer shape as the frame portion 131. When viewed in the up and down direction, an outer edge portion 111e of the first substrate 111, an outer edge portion 113e of the first metal layer 113, an outer edge portion 141e of a first solder 141, an outer edge portion 131e of the frame portion 131, an outer edge portion 142e of a second solder 142, an outer edge portion 114e of the second metal layer 114, and an outer edge portion 112e of the second substrate 112 are disposed in the same position. When viewed in the up and down direction, an inner edge portion 113f of the first metal layer 113, an inner edge portion 141f of the first solder 141, an inner edge portion 131f of the frame portion 131, an inner edge portion 142f of the second solder 142, and an inner edge portion 114f of the second metal layer 114 are disposed in the same position. Since the first solder 141 and the second solder 142 do not have a fillet shape, there is a possibility that unevenness occurs and a cavity S that communicates an outer side and an inner side is generated in a bonding film between the first substrate 111 and the frame portion 131, and a bonding film between the frame portion 131 and the second substrate 112.

Modified Example

Figure 7:
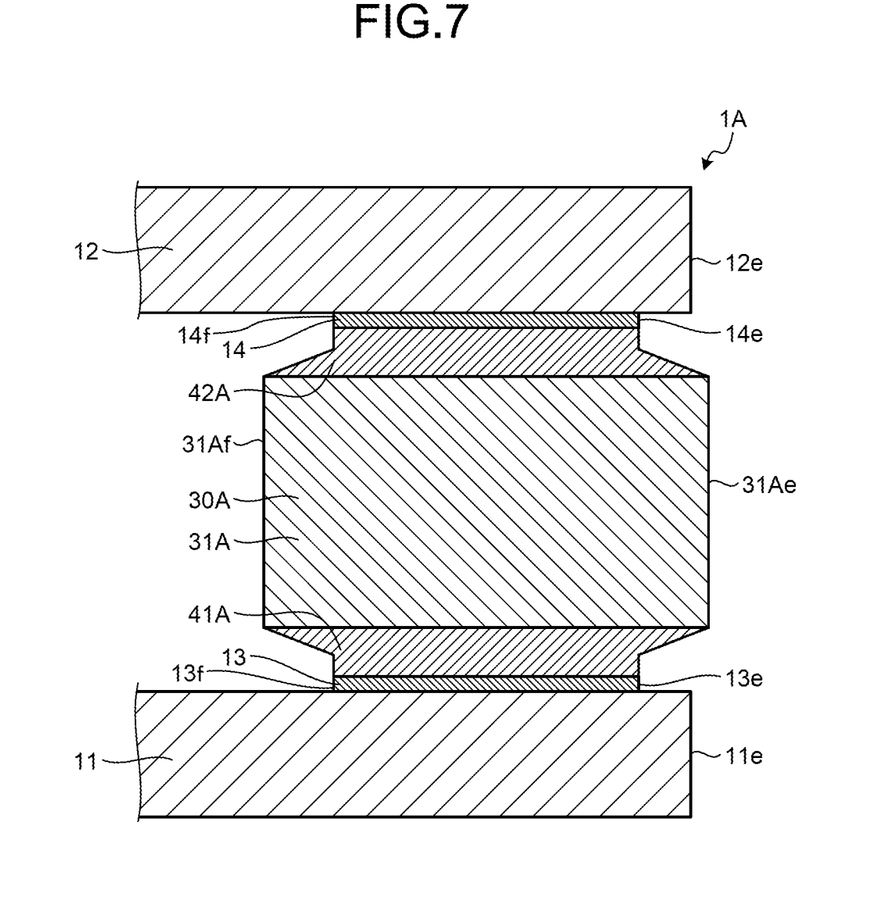
FIG. 7 is a cross-sectional view illustrating a modified example of a thermoelectric power generation module according to an embodiment, and is a partial enlarged view of FIG. 2.

FIG. 7 is a cross-sectional view illustrating a modified example of the thermoelectric power generation module according to the embodiment, and is a partial enlarged view of FIG. 2. A frame portion 31A of a frame portion 30A has a larger outer shape compared with the first substrate 11 and the second substrate 12. In other words, in a thermoelectric power generation module 1A, an outer edge portion 31Ae of the frame portion 31A is disposed so as to be deviated outward from the outer edge portion 11e of the first substrate 11 and the outer edge portion 12e of the second substrate 12 when viewed in the up and down direction. Accordingly, the frame portion 31A has a step portion protruding outward more than the first substrate 11 and the second substrate 12 in a side view. When viewed in the up and down direction, the outer edge portion 13e of the first metal layer 13 on the first substrate 11 and the outer edge portion 14e of the second metal layer 14 on the second substrate 12 are positioned so as to be deviated inward from the outer edge portion 31Af of the frame portion 31A. At least any of the outer edge portion 41e of the first solder 41 and the outer edge portion 42e of the second solder 42 may be disposed so as to be deviated inward from the outer edge portion 31Ae of the frame portion 31A when viewed in the up and down direction. In the embodiment, the outer edge portion 41e of the first solder 41 and the outer edge portion 42e of the second solder 42 are disposed so as to be deviated inward from the outer edge portion 31Ae of the frame portion 31A when viewed in the up and down direction. At least any of the inner edge portion 41f of the first solder 41 and the inner edge portion 42f of the second solder 42 may be disposed so as to be deviated outward from an inner edge portion 31Af of the frame portion 31A when viewed in the up and down direction. In the embodiment, the inner edge portion 41f of the first solder 41 and the inner edge portion 42f of the second solder 42 are disposed so as to be deviated outward from the inner edge portion 31Af of the frame portion 31A when viewed in the up and down direction. Accordingly, a first solder 41A has a fillet shape that expands from the first substrate 11 toward the frame portion 31A. A second solder 42A has a fillet shape that expands from the second substrate 12 toward the frame portion 31A. In this configuration, the sealing property can be improved as in the embodiment.

In the above description, the first solder pattern 15, the second solder pattern 16, the first solder pattern 33, and the second solder pattern 34 are formed by the dot-shaped solders, but the present disclosure is not limited to this, and for example, the first solder pattern 15, the second solder pattern 16, the first solder pattern 33, and the second solder pattern 34 may be formed by an annular solder continuous in the peripheral direction.

In the above description, when the first substrate 11 and the second substrate 12 are ceramic substrates, the solder wettably spreads on the ceramic substrate. Therefore, the first metal layer 13 and the second metal layer 14 may not be provided.

According to the present disclosure, the sealing property can be improved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A thermoelectric power generation module comprising:
   a first substrate that includes a first surface;
   a second substrate that includes a second surface facing the first surface;
   a thermoelectric conversion element that is disposed between the first surface and the second surface;
   a sealing portion that is disposed between the first surface and the second surface and seals a peripheral edge portion of the first surface and a peripheral edge portion of the second surface, the sealing portion having a frame shape that surrounds the peripheral edge portion of the first surface and the peripheral edge portion of the second surface to thereby define an opening portion that receives the thermoelectric conversion element;
   a first solder that is disposed between the first surface and a first side of the sealing portion, the first side facing the first surface; and
   a second solder that is disposed between the second surface and a second side of the sealing portion, the second side facing the second surface,
   wherein at least one of an outer edge portion of the first solder or an inner edge portion of the first solder is deviated from a lateral surface of the sealing portion and extends from the first side of the sealing portion toward the first surface to thereby define a fillet shape between the first surface and the first side of the sealing portion, and
   wherein at least one of an outer edge portion of the second solder or an inner edge portion of the second solder is deviated from the lateral surface of the sealing portion and extends from the second side of the sealing portion toward the second surface to thereby define a fillet shape between the second surface and the second side of the sealing portion.

2. The thermoelectric power generation module according to claim 1, further comprising:
   a first metal layer that is formed in a frame shape in the peripheral edge portion of the first surface; and
   a second metal layer that is formed in a frame shape in the peripheral edge portion of the second surface, wherein:
   the first solder is disposed on the first metal layer,
   the second solder is disposed on the second metal layer,
   the first solder fixes the first surface and the sealing portion via the first metal layer, and
   the second solder fixes the second surface and the sealing portion via the second metal layer.

3. The thermoelectric power generation module according to claim 1, wherein at least one of the outer edge portion of the first solder or the outer edge portion of the second solder is deviated outward from an outer edge lateral surface of the sealing portion that faces opposite to the opening portion.

4. The thermoelectric power generation module according to claim 1, wherein at least one of the inner edge portion of the first solder or the inner edge portion of the second solder is disposed so as to be deviated inward from an inner lateral surface of the sealing portion that faces the opening portion.

5. The thermoelectric power generation module according to claim 1, wherein at least one of the outer edge portion of the first solder or the outer edge portion of the second solder is deviated inward from an outer lateral surface of the sealing portion that faces opposite to the opening portion.

6. The thermoelectric power generation module according to claim 5, wherein at least one of the inner edge portion of the first solder or the inner edge portion of the second solder is deviated outward from an inner lateral surface of the sealing portion that faces the opening portion.

7. The thermoelectric power generation module according to claim 1, wherein both of the outer edge portion of the first solder and the outer edge portion of the second solder are deviated outward from an outer lateral surface of the sealing portion that faces opposite to the opening portion.

8. The thermoelectric power generation module according to claim 7, wherein both of the inner edge portion of the first solder and the inner edge portion of the second solder are deviated inward from an inner lateral surface of the sealing portion that faces the opening portion.

9. The thermoelectric power generation module according to claim 1, wherein both of the outer edge portion of the first solder and the outer edge portion of the second solder are deviated inward from an outer lateral surface of the sealing portion that faces opposite to the opening portion.

10. The thermoelectric power generation module according to claim 9, wherein both of the inner edge portion of the first solder and the inner edge portion of the second solder are deviated outward from an inner lateral surface of the sealing portion that faces the opening portion.

11. The thermoelectric power generation module according to claim 1, wherein at least a part of the sealing portion is made of copper.

12. The thermoelectric power generation module according to claim 1, wherein the sealing portion comprises a frame portion that defines the opening portion, the frame portion extending between the first side of the sealing portion and the second side of the sealing portion.

13. The thermoelectric power generation module according to claim 12, wherein the frame portion of the sealing portion is made of copper.

14. The thermoelectric power generation module according to claim 1, wherein the sealing portion is laterally spaced apart from the thermoelectric conversion element.

15. The thermoelectric power generation module according to claim 1, wherein the first side of the sealing portion defines a lower end of the sealing portion, and the second side of the sealing portion defines an upper end of the sealing portion.

16. The thermoelectric power generation module according to claim 1, wherein each of (i) the fillet shape defined between the first surface and the first side of the sealing portion and (ii) the fillet shape defined between the second surface and the second side of the sealing portion includes an inclined surface that is inclined with respect to the lateral surface of the sealing portion.

* * * * *